United States Patent
Xue

(10) Patent No.: US 11,094,617 B2
(45) Date of Patent: Aug. 17, 2021

(54) SEMICONDUCTOR PACKAGE INCLUDING LOW SIDE FIELD-EFFECT TRANSISTORS AND HIGH SIDE FIELD-EFFECT TRANSISTORS AND METHOD OF MAKING THE SAME

(71) Applicant: Alpha and Omega Semiconductor (Cayman), Ltd, Grand Cayman (KY)

(72) Inventor: Yan Xun Xue, Los Gatos, CA (US)

(73) Assignee: ALPHA AND OMEGA SEMICONDUCTOR (CAYMAN), LTD., Grand Cayman (KY)

( * ) Notice: Subject to any disclaimer, the term of this patent is extended or adjusted under 35 U.S.C. 154(b) by 0 days.

(21) Appl. No.: 16/455,597

(22) Filed: Jun. 27, 2019

(65) Prior Publication Data
US 2020/0411422 A1    Dec. 31, 2020

(51) Int. Cl.
*H01L 23/495* (2006.01)
*H01L 23/00* (2006.01)
*H01L 49/02* (2006.01)
*H01L 21/48* (2006.01)
*H01L 21/56* (2006.01)
*H01L 21/78* (2006.01)
*H01L 23/31* (2006.01)

(52) U.S. Cl.
CPC .... *H01L 23/49575* (2013.01); *H01L 21/4825* (2013.01); *H01L 21/565* (2013.01); *H01L 21/78* (2013.01); *H01L 23/3107* (2013.01); *H01L 23/49513* (2013.01); *H01L 23/49562* (2013.01); *H01L 24/40* (2013.01); *H01L 24/48* (2013.01); *H01L 28/10* (2013.01); *H01L 2224/4005* (2013.01); *H01L 2224/40137* (2013.01); *H01L 2224/48245* (2013.01); *H01L 2924/14252* (2013.01); *H01L 2924/19042* (2013.01); *H01L 2924/19104* (2013.01)

(58) Field of Classification Search
CPC ......... H01L 23/49575; H01L 23/49513; H01L 23/3107; H01L 21/4825; H01L 21/565; H01L 2224/40137; H01L 24/40; H01L 2924/1306; H01L 2924/181; H01L 2924/13091; H01L 2924/45014; H01L 2924/19042; H01L 23/48513
See application file for complete search history.

(56) References Cited

U.S. PATENT DOCUMENTS 8,399,997 B2 *   3/2013  Zhang .................... H01L 24/97
                                                            257/782
9,478,442 B2 * 10/2016  Girdhar ................. H02M 3/155
(Continued)

*Primary Examiner* — Khiem D Nguyen
(74) *Attorney, Agent, or Firm* — Chen-Chi Lin

(57) ABSTRACT

A semiconductor package comprises a lead frame, a first field-effect transistor (FET), a second low side FET, a first high side FET, a second high side FET, a first metal clip, a second metal clip, and a molding encapsulation. The semiconductor package further comprises an optional integrated circuit (IC) controller or an optional inductor. A method for fabricating a semiconductor package. The method comprises the steps of providing a lead frame; attaching a first low side FET, a second low side FET, a first high side FET, and a second high side FET to the lead frame; mounting a first metal clip and a second metal clip; forming a molding encapsulation; and applying a singulation process.

17 Claims, 13 Drawing Sheets

(56) References Cited

U.S. PATENT DOCUMENTS

| | | | | |
|---|---|---|---|---|
| 2007/0228534 A1* | 10/2007 | Uno | ................... | H01L 23/49575 |
| | | | | 257/678 |
| 2012/0326287 A1* | 12/2012 | Joshi | ................. | H01L 23/49562 |
| | | | | 257/676 |
| 2013/0049137 A1* | 2/2013 | Uno | ....................... | H02M 1/32 |
| | | | | 257/401 |
| 2014/0061884 A1* | 3/2014 | Carpenter | ............... | H01L 24/37 |
| | | | | 257/676 |
| 2014/0361419 A1* | 12/2014 | Xue | ........................ | H01L 24/17 |
| | | | | 257/676 |
| 2015/0179626 A1* | 6/2015 | Zhang | ............... | H01L 23/49562 |
| | | | | 438/17 |
| 2015/0214189 A1* | 7/2015 | Tan | .................... | H01L 23/3121 |
| | | | | 257/773 |
| 2015/0357267 A1* | 12/2015 | Ho | .................... | H01L 23/49562 |
| | | | | 257/676 |
| 2017/0287820 A1* | 10/2017 | Ahlers | .................... | H02M 7/44 |
| 2018/0102306 A1* | 4/2018 | Cho | ................. | H01L 23/49562 |
| 2018/0108601 A1* | 4/2018 | Niu | .................... | H01L 27/0629 |
| 2018/0277513 A1* | 9/2018 | Macheiner | ........ | H01L 23/49562 |

* cited by examiner

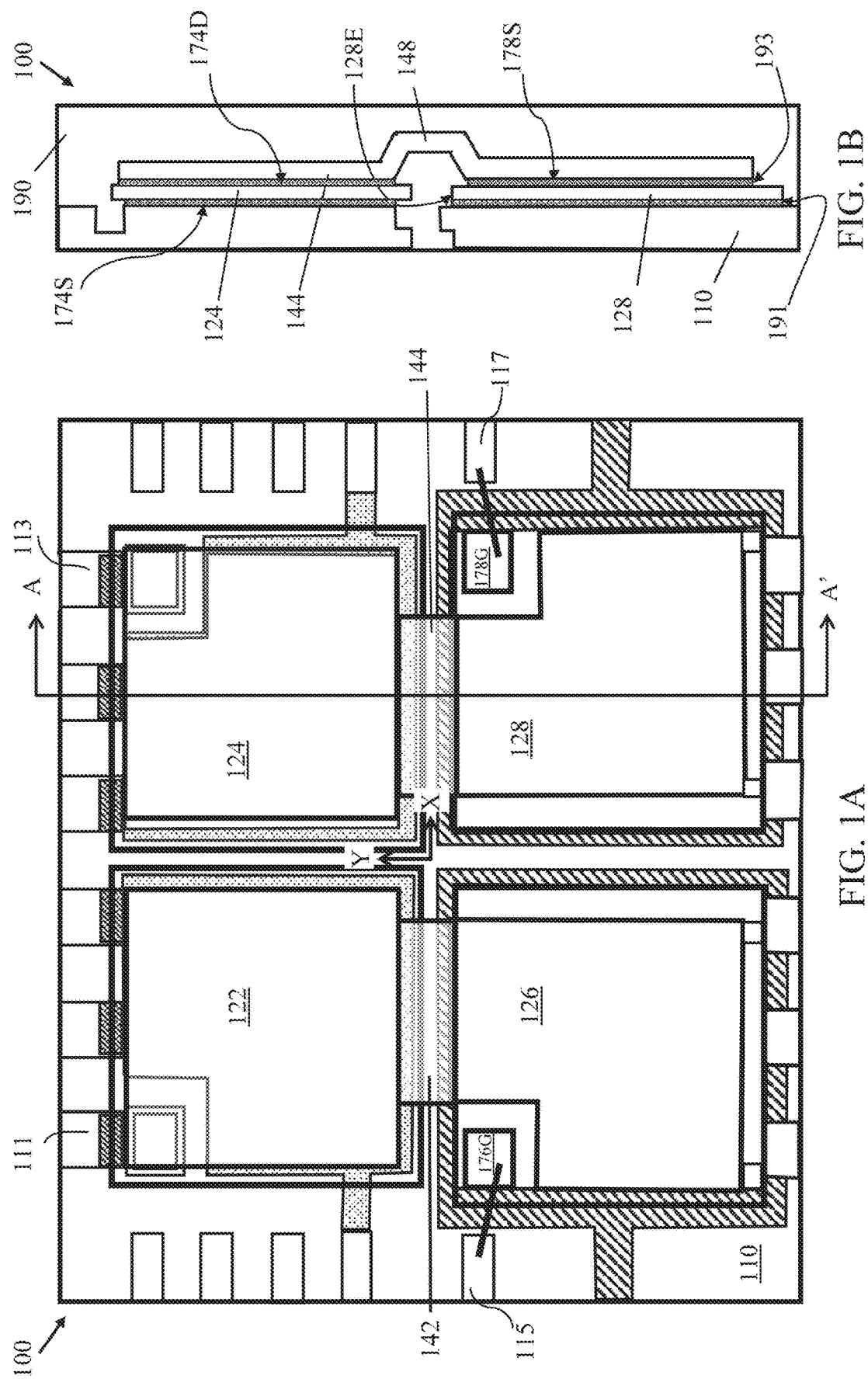

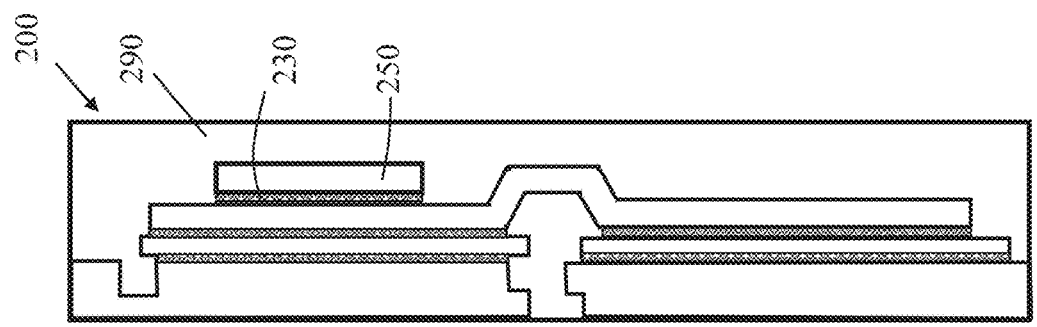
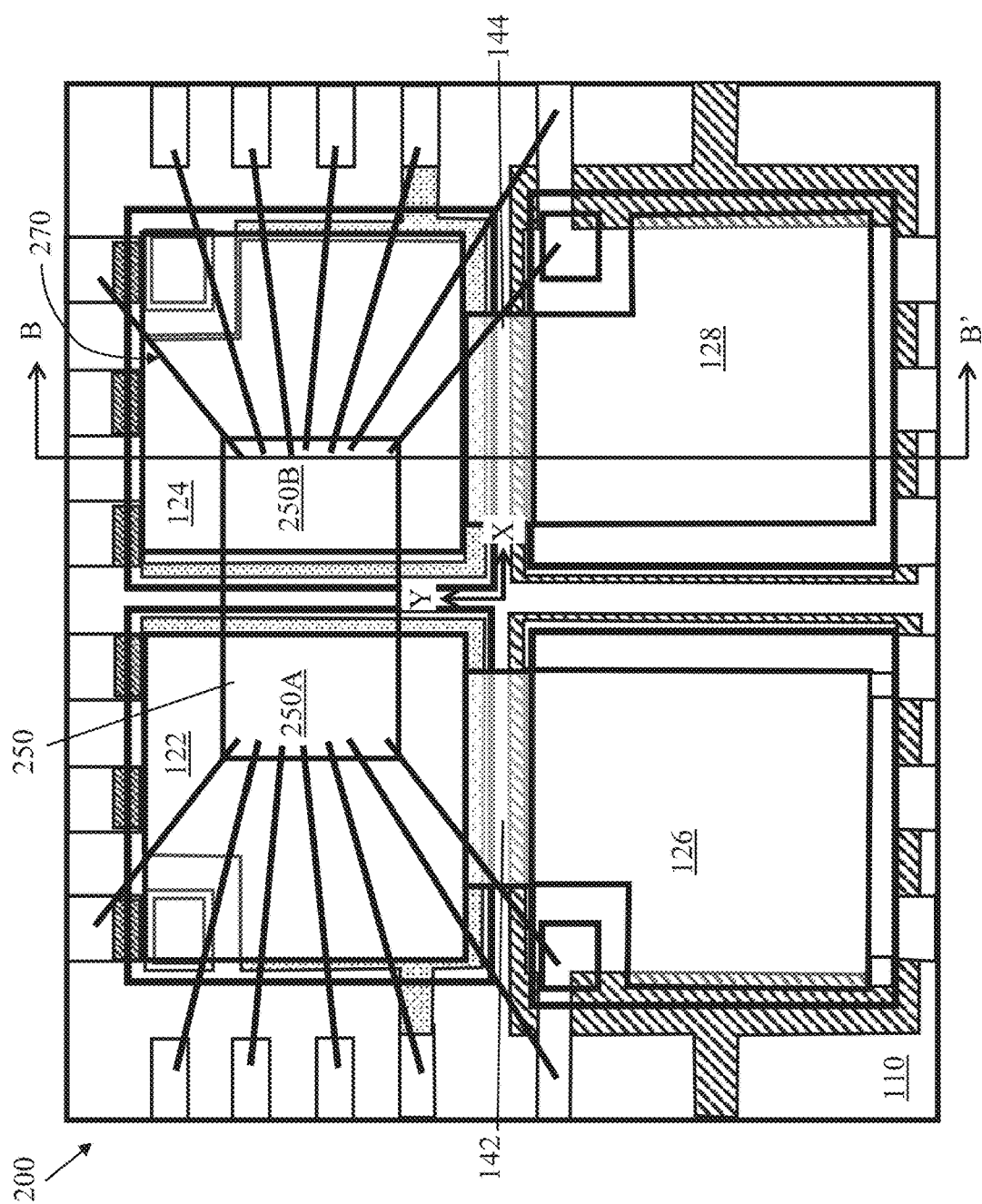
FIG. 2A
FIG. 2B

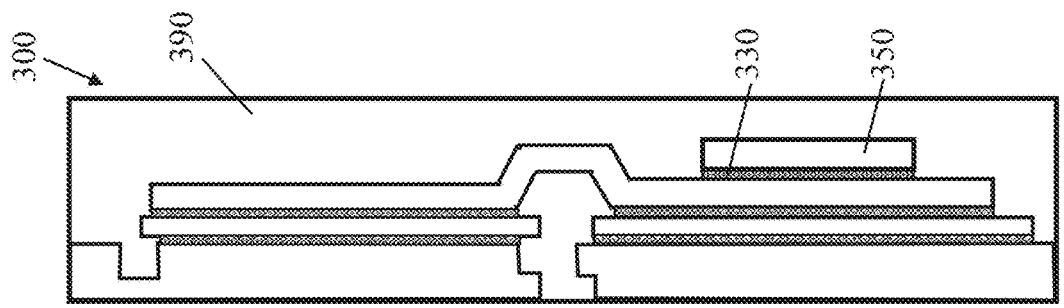
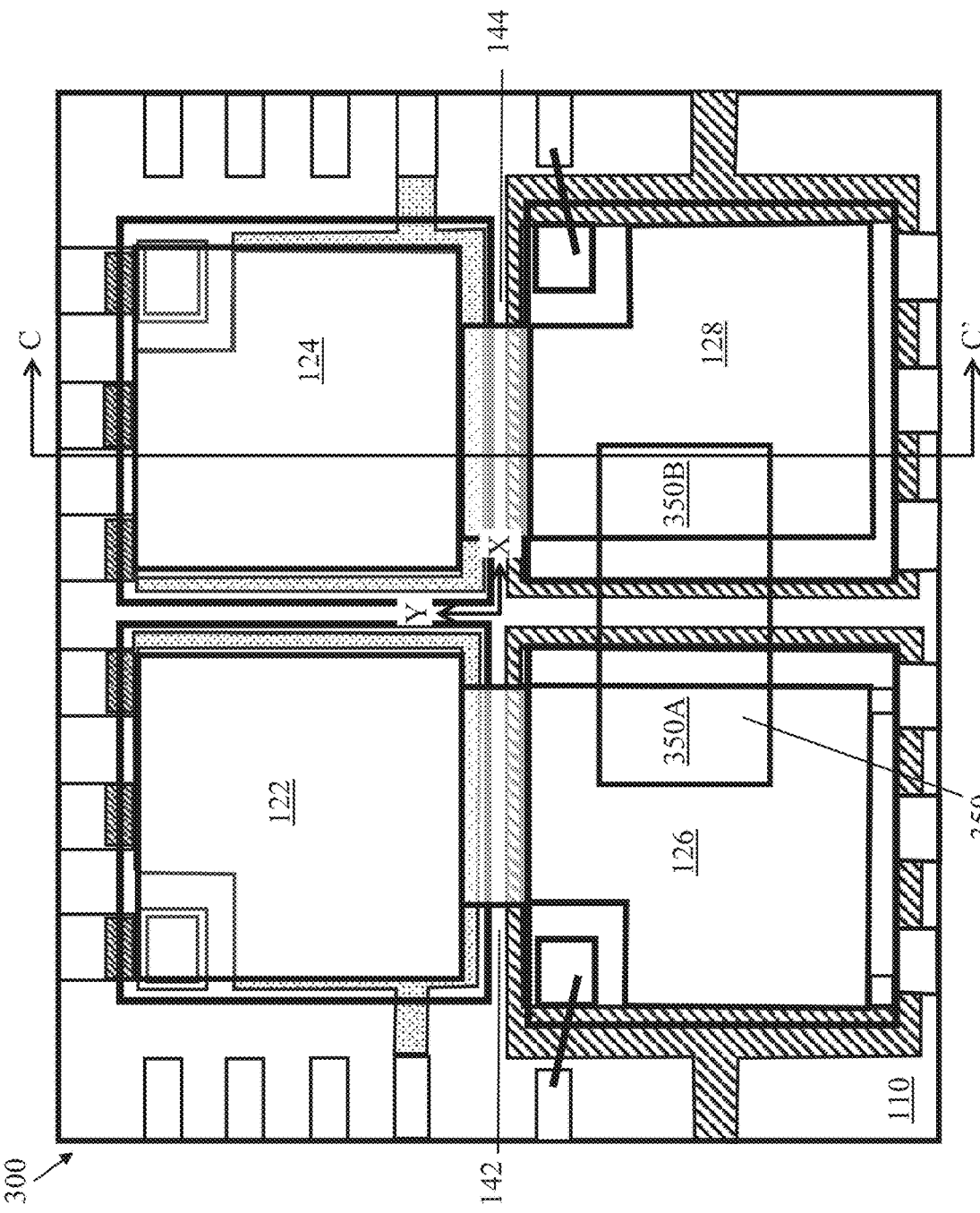
FIG. 3B
FIG. 3A

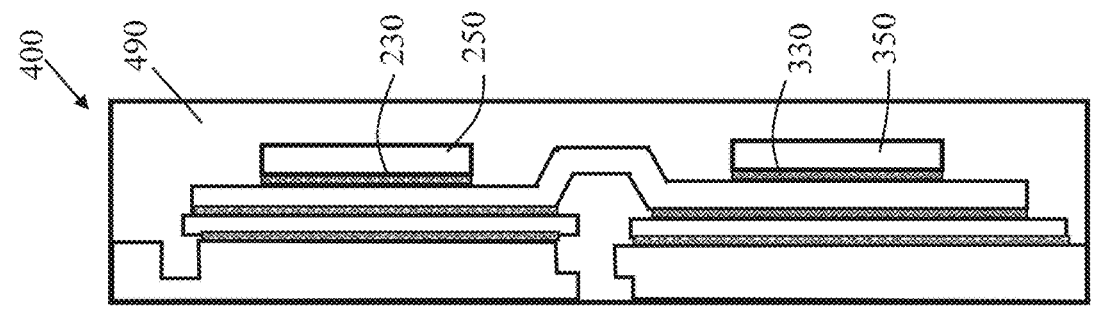
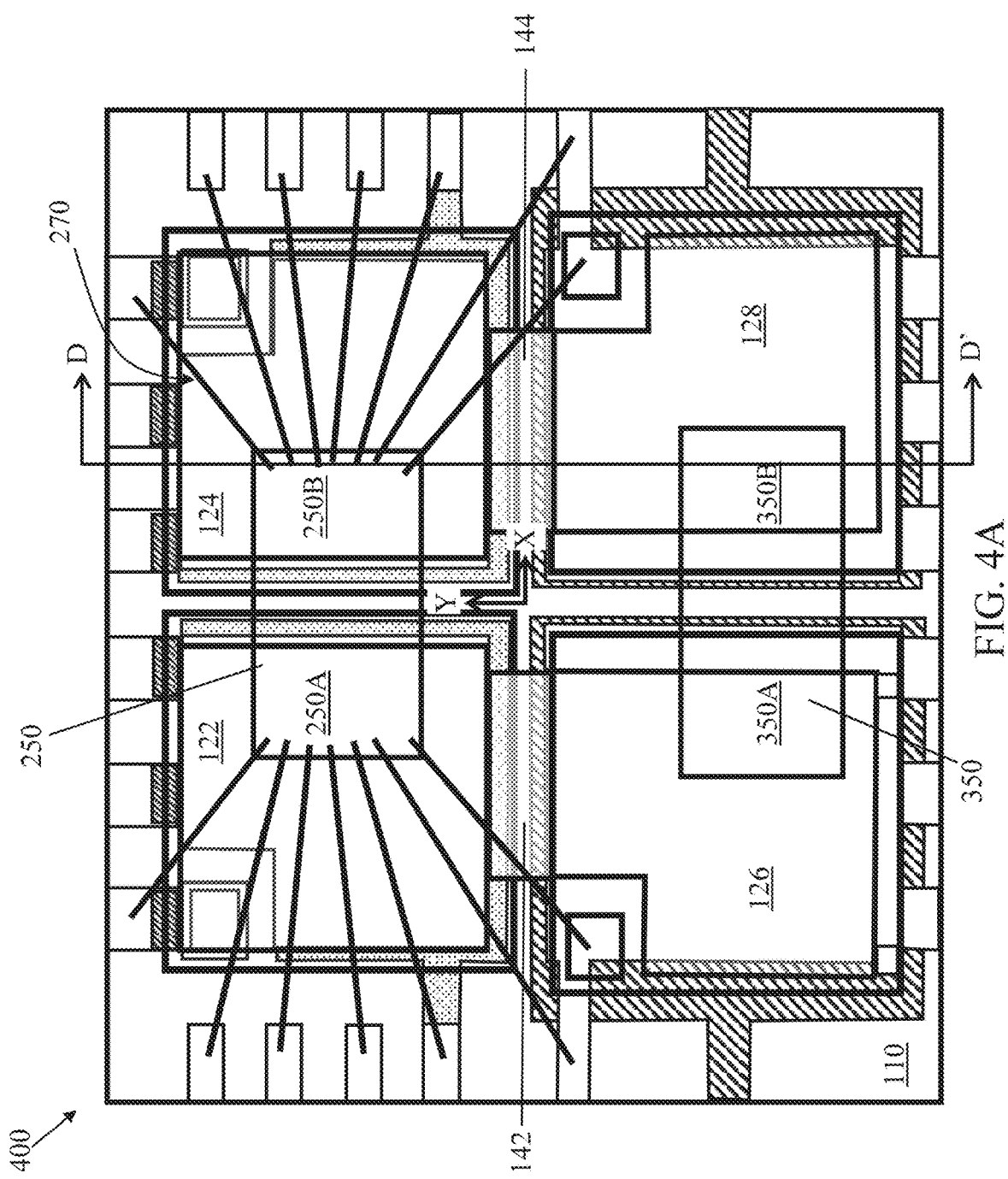
FIG. 4A
FIG. 4B

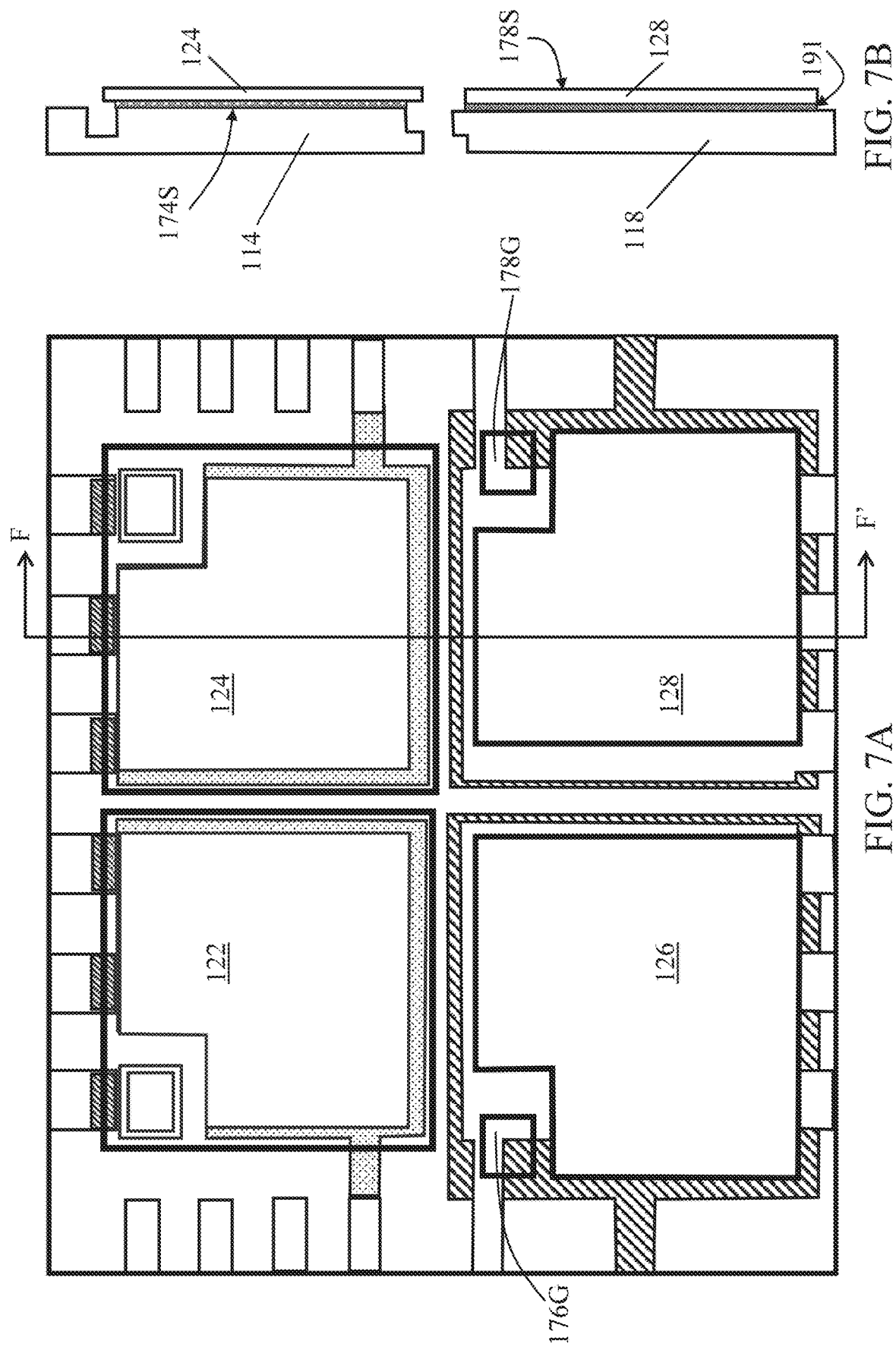

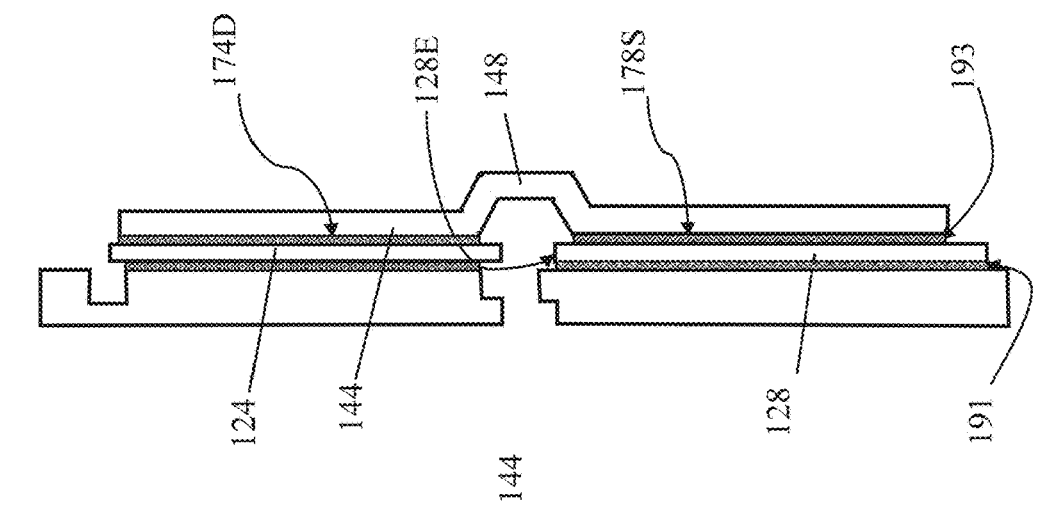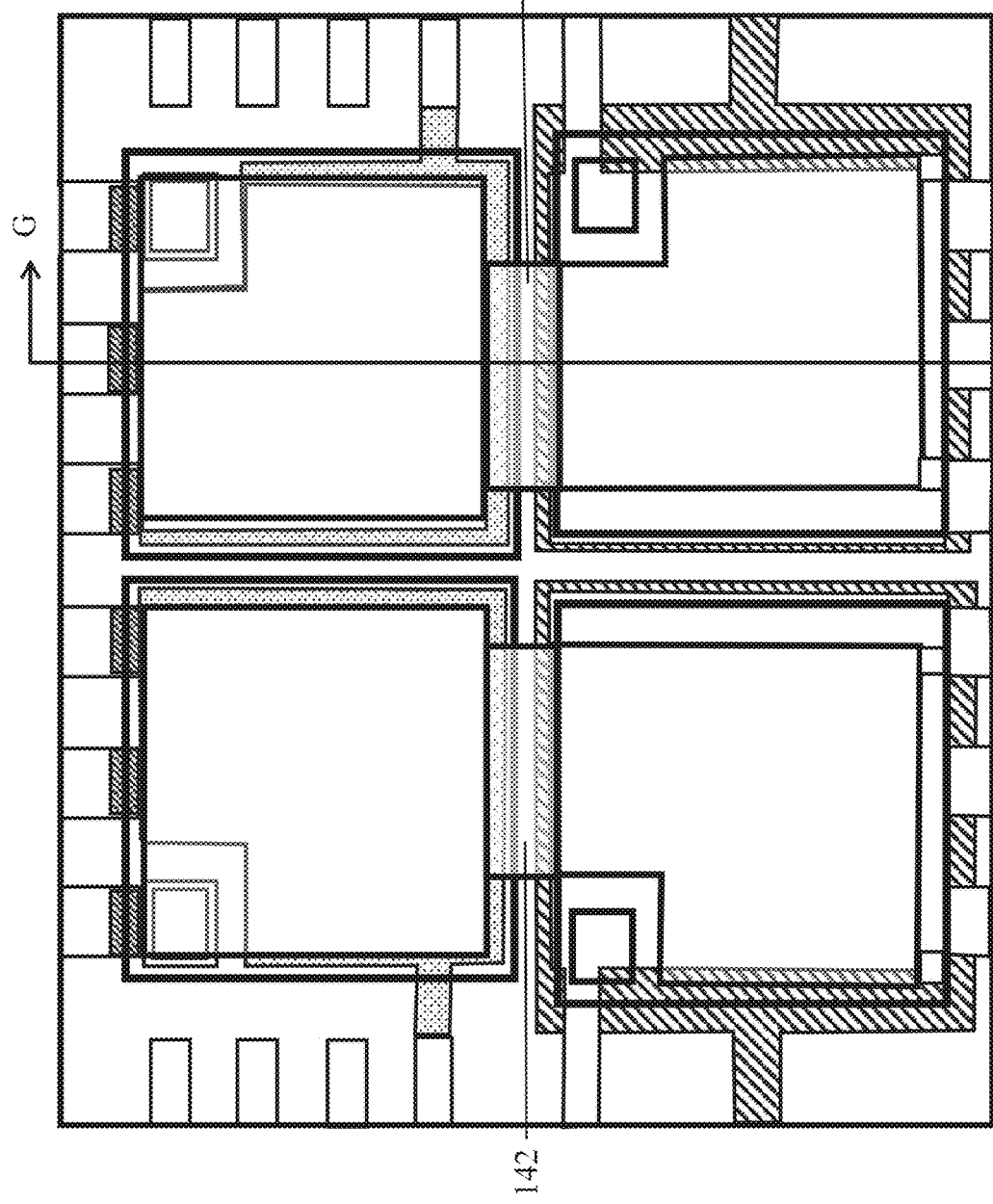
FIG. 8B
FIG. 8A

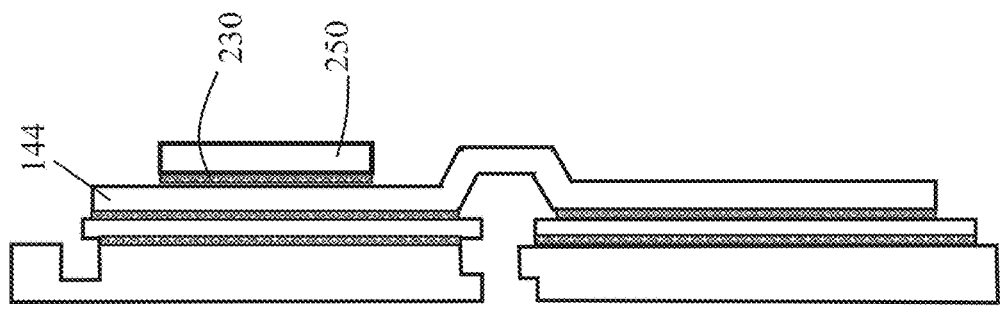
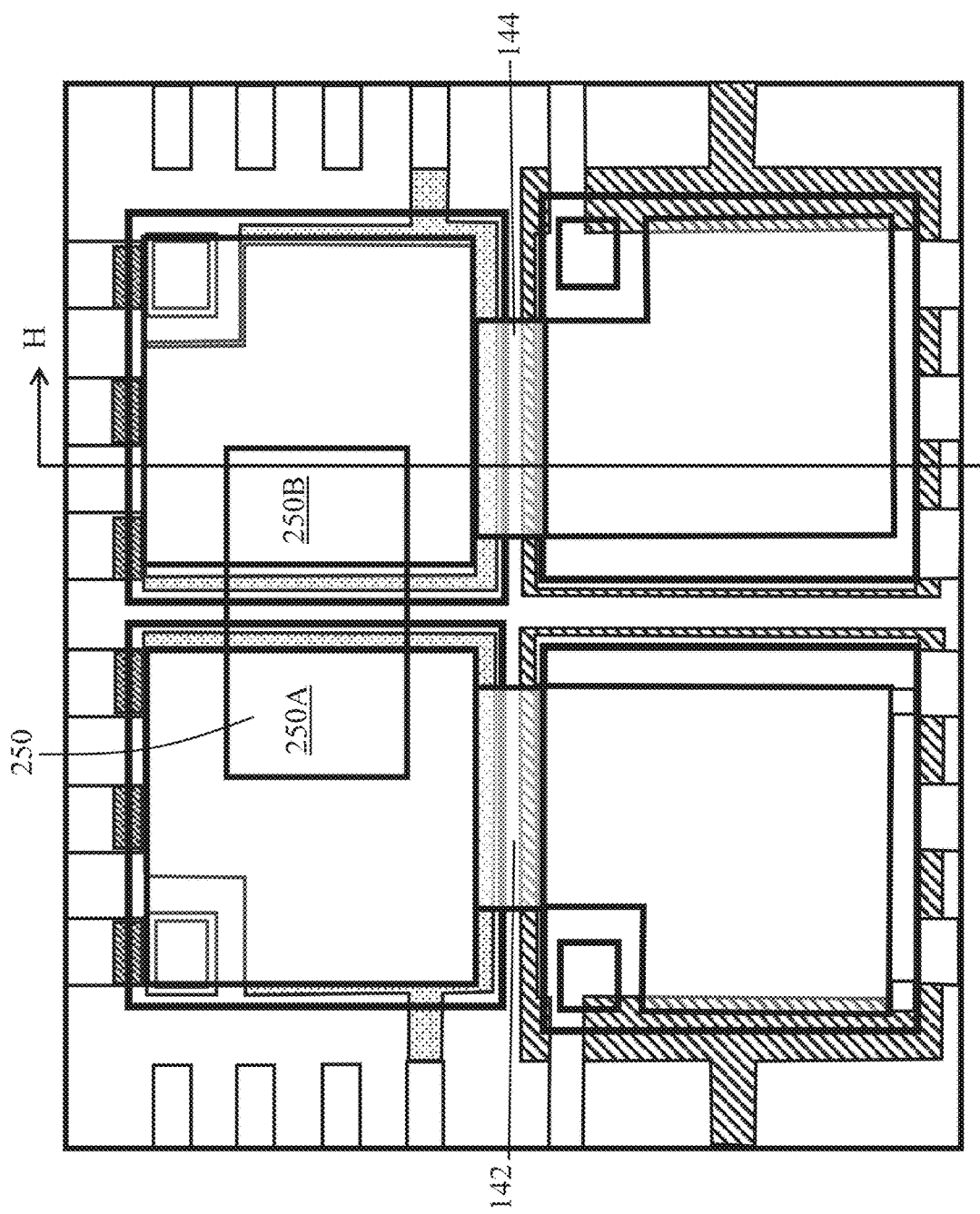
FIG. 9A
FIG. 9B

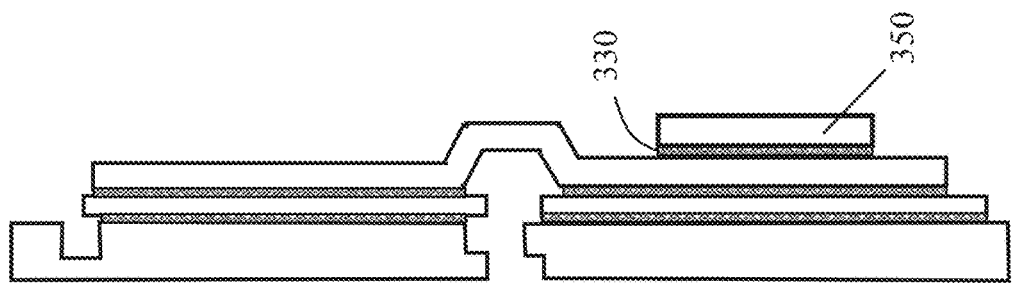
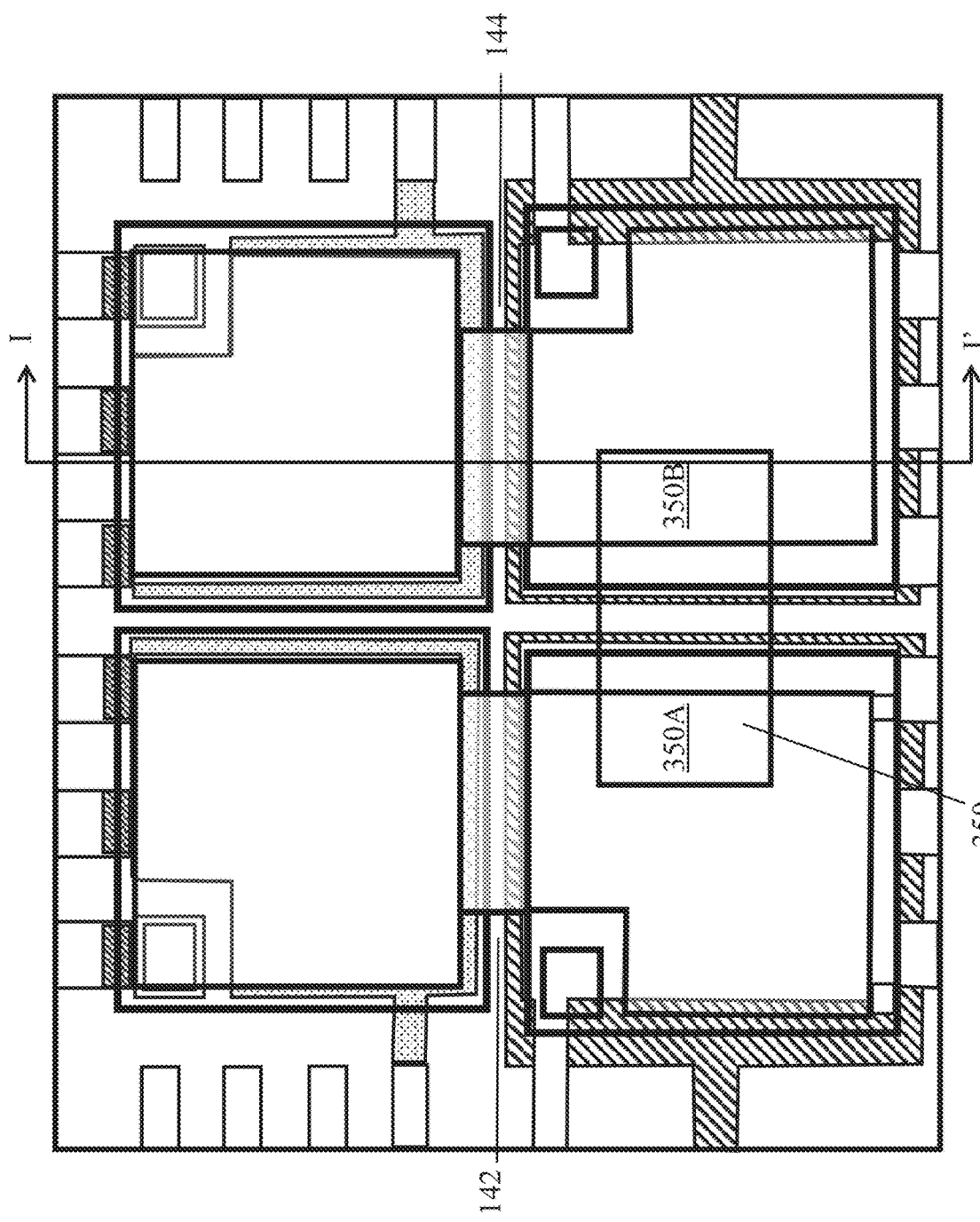
FIG. 10A
FIG. 10B

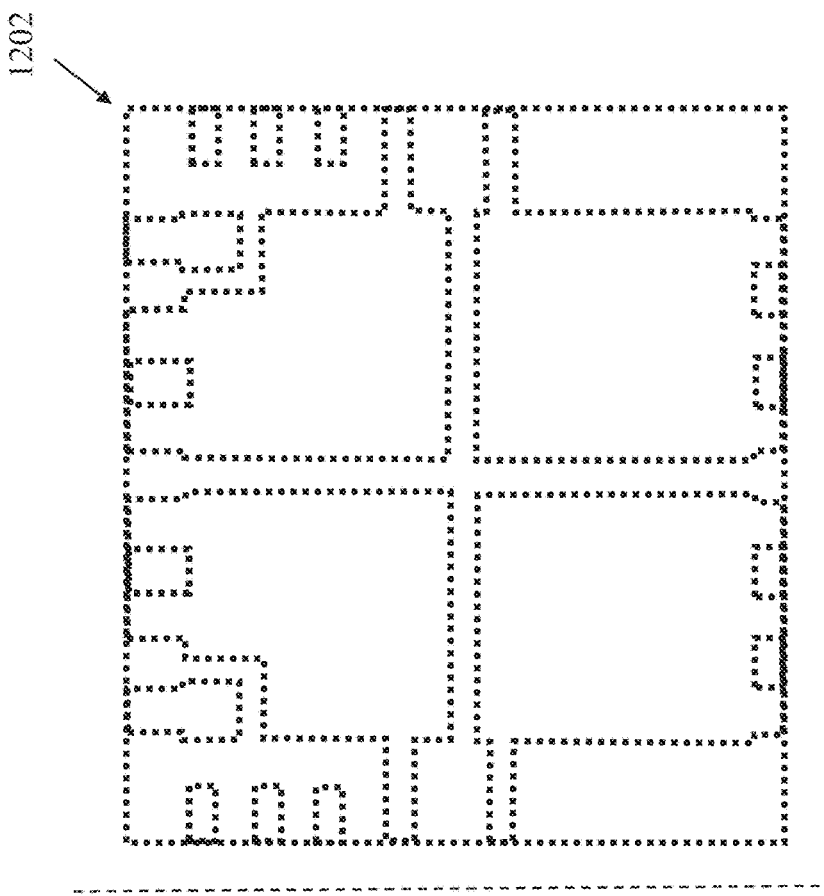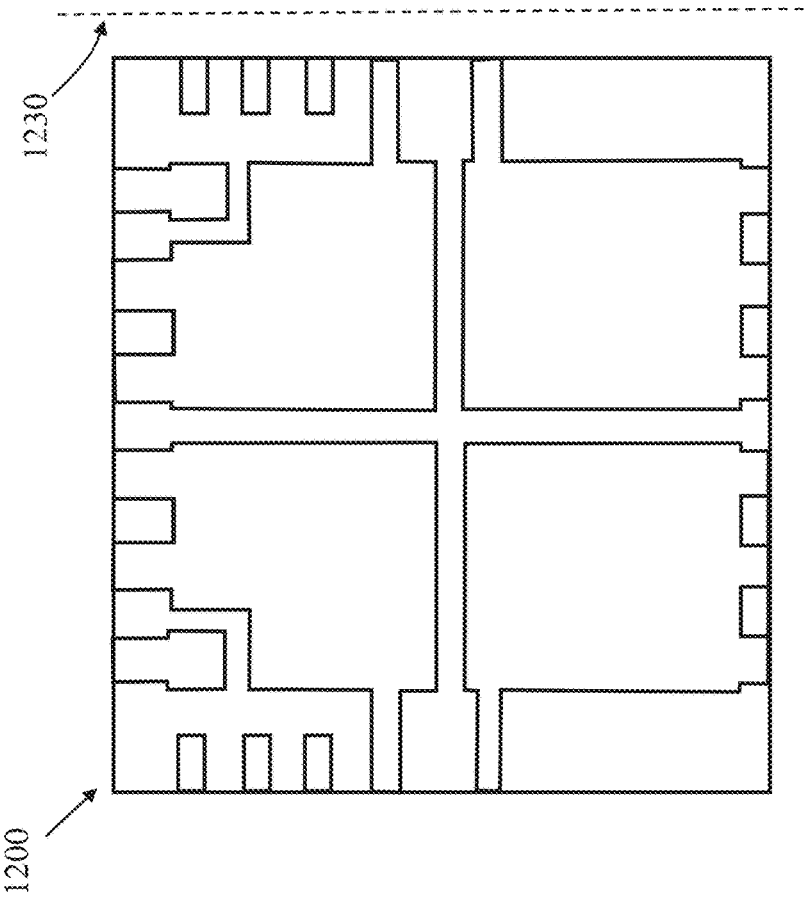
FIG. 12

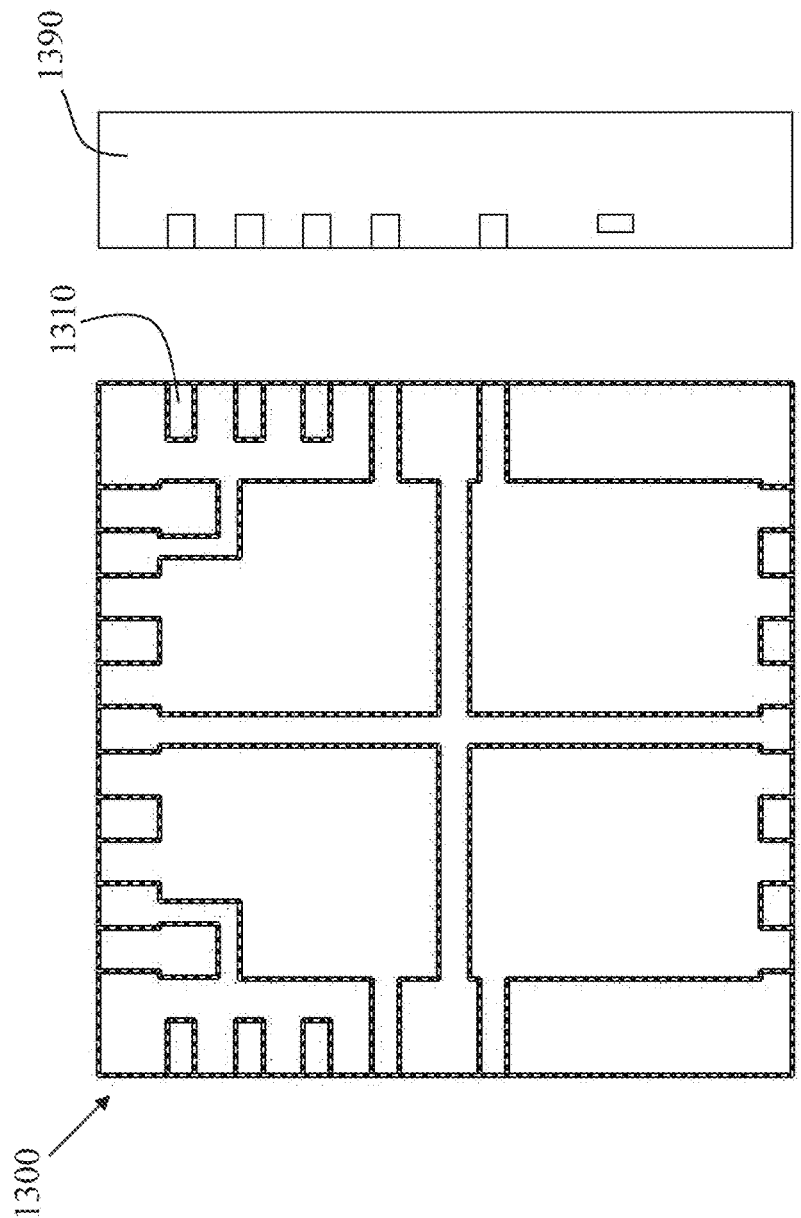
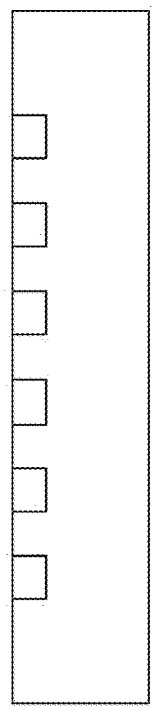
FIG. 13A
FIG. 13B
FIG. 13C

SEMICONDUCTOR PACKAGE INCLUDING LOW SIDE FIELD-EFFECT TRANSISTORS AND HIGH SIDE FIELD-EFFECT TRANSISTORS AND METHOD OF MAKING THE SAME

FIELD OF THE INVENTION

This invention relates generally to a semiconductor package and a method of making the same. More particularly, the present invention relates to Buck-Boost power controller and a method of making the same.

BACKGROUND OF THE INVENTION

A conventional Buck-Boost power controller comprises two separated semiconductor packages each comprising two field-effect transistors (FETs). A typical size of each package of the conventional Buck-Boost power controller is 5 mm by 3 mm. A typical size of two packages of the conventional Buck-Boost power controller is 5 mm by 6 mm. The Buck-Boost power controller of the present disclosure comprises at least four FETs in a single package. A typical size the single package of the Buck-Boost power controller of the present disclose is 5 mm by 5 mm (a reduction in size from 5 mm by 6 mm of a conventional Buck-Boost power controller with two separated semiconductor packages).

The impedance of the Buck-Boost power controller of the present disclosure is reduced because of shorter electrical paths within a same single package. The number of pin outs of the present disclosure is reduced because of no need to connect a first package of a conventional Buck-Boost power controller to a second package of the same conventional Buck-Boost power controller.

SUMMARY OF THE INVENTION

The present invention discloses a semiconductor package comprising a lead frame, a first low side FET, a second low side FET, a first high side FET, a second high side FET, a first metal clip, a second metal clip, and a molding encapsulation. The semiconductor package further comprises an optional integrated circuit (IC) controller or an optional inductor.

A method for fabricating a semiconductor package is also disclosed. The method comprises the steps of providing a lead frame; attaching a first low side FET, a second low side FET, a first high side FET, and a second high side FET to the lead frame; mounting a first metal clip and a second metal clip; forming a molding encapsulation; and applying a singulation process.

BRIEF DESCRIPTION OF THE DRAWINGS

FIG. 1A is a top view and FIG. 1B is a cross sectional plot of a semiconductor package in examples of the present disclosure.

FIG. 2A is a top view and FIG. 2B is a cross sectional plot of another semiconductor package in examples of the present disclosure.

FIG. 3A is a top view and FIG. 3B is a cross sectional plot of still another semiconductor package in examples of the present disclosure.

FIG. 4A is a top view and FIG. 4B is a cross sectional plot of yet still another semiconductor package in examples of the present disclosure.

FIGS. 6A, 7A, 8A, 9A, 10A, 11A, and 12 show top views and FIGS. 6B, 7B, 8B, 9B, 10B, and 11B show cross sectional plots of steps of the process to fabricate the semiconductor package in examples of the present disclosure.

FIG. 13A is a bottom view, and FIG. 13B is a side view, and FIG. 13C is a front view of a semiconductor package in examples of the present disclosure.

DETAILED DESCRIPTION OF THE INVENTION

Figure 5:
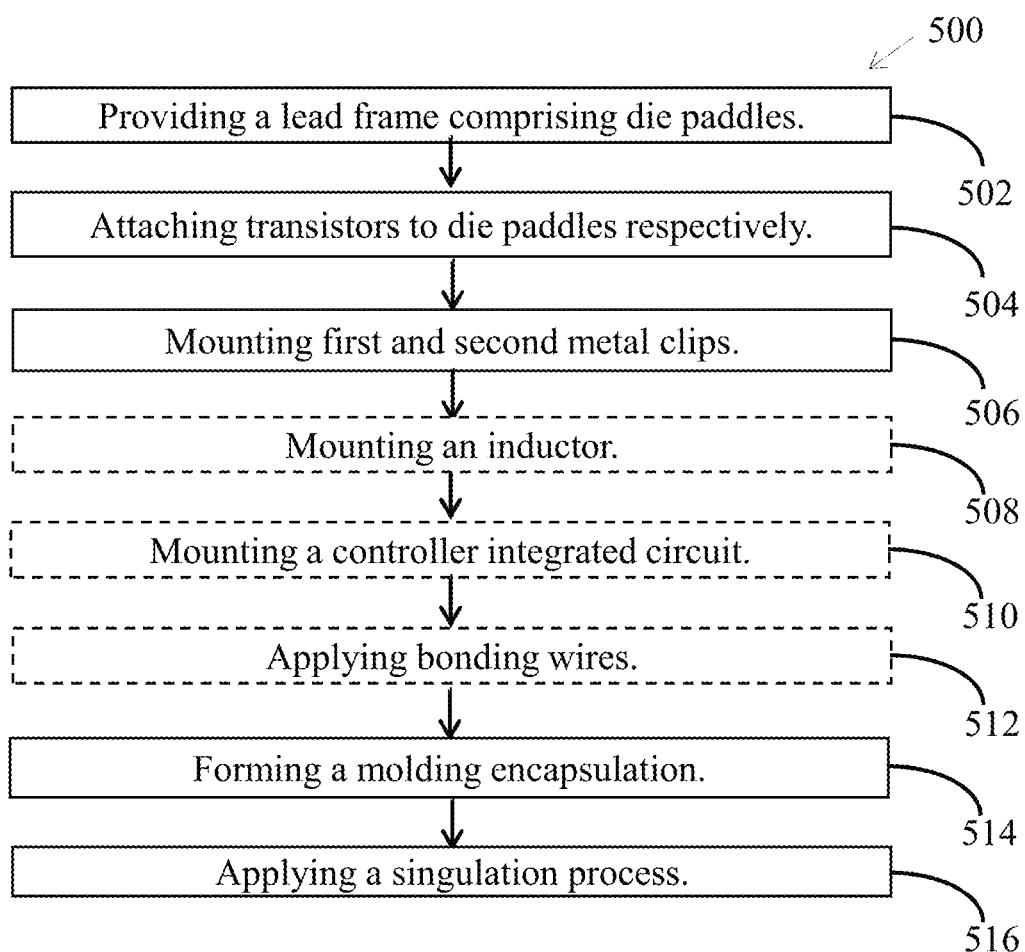
FIG. 5 is a flowchart of a process to develop a semiconductor package in examples of the present disclosure.

FIG. 1A is a top view and FIG. 1B is a cross sectional plot along AA' of a semiconductor package 100 in examples of the present disclosure. The semiconductor package 100 comprises a lead frame 110, a first low side field-effect transistor (FET) 122, a second low side FET 124, a first high side FET 126, a second high side FET 128, a first metal clip 142, a second metal clip 144, and a molding encapsulation 190. In one example, for viewing purpose, the molding encapsulation 190 is shown in transparent in FIGS. 1A and 1B. In one example, the semiconductor package 100 is symmetric with respect to Y axis. The semiconductor package 100 is not symmetric with respect to X axis because the first low side FET 122 is above the X axis and first high side FET 126 is below the X axis. The lead frame 110 comprises a first die paddle 112, a second die paddle 114, a third die paddle 116 and a fourth die paddle 118 (see FIG. 6A).

The first low side FET 122 is flipped and attached to the first die paddle 112. The first low side FET 122 comprises a source electrode on a top surface of the first low side FET 122 (flipped and connected to source pad 612S of the first die paddle 112 of FIG. 6A) and a gate electrode on the top surface of the first low side FET 122 (flipped and connected to gate pad 612G of FIG. 6A). The second low side FET 124 is flipped and attached to the second die paddle 114. The second low side FET 124 comprises a source electrode 174S on a top surface of the second low side FET 124 (flipped and connected to source pad 614S of the second die paddle 114 of FIG. 6A) and a gate electrode on the top surface of the second low side FET 124 (flipped and connected to gate pad 614G of FIG. 6A). The first high side FET 126 is attached to the third die paddle 116. The first high side FET 126 comprises a source electrode and a gate electrode 176G on a top surface of the first high side FET 126 and a drain electrode on a bottom surface of the first high side FET 126 attached to the third die paddle 116. The second high side FET 128 is attached to the fourth die paddle 118. The second high side FET 128 comprises a source electrode 178S and a gate electrode 178G on a top surface of the second high side FET 128 and a drain electrode on a bottom surface of the second high side FET 128 attached to the fourth die paddle 118. The first metal clip 142 connects a drain electrode disposed on a bottom surface of the first low side FET 122 to the source electrode of the first high side FET 126. A second metal clip 144 connects a drain electrode 174D disposed on a bottom surface of the second low side FET 124 to the source electrode 178S of the second high side FET 128. A molding encapsulation 190 encloses the first low side FET 122, the second low side FET 124, the first high side FET 126, the second high side FET 128, the first metal clip 142, the second metal clip 144, and a majority portion of the lead frame 110.

In examples of the present disclosure, the second high side FET 128 is attached to the fourth die paddle 118 through a layer of solder paste 191. A top surface of the fourth die paddle 118 is directly attached to a bottom surface of the layer of solder paste 191. A top surface of the layer of solder paste 191 is directly attached to a bottom surface of the second high side FET 128. In examples of the present disclosure, the layer of solder paste 191 has a constant thickness. The second metal clip 144 is attached to the second high side FET 128 through a layer of solder paste 193. A top surface of the second high side FET 128 is directly attached to a bottom surface of the layer of solder paste 193. A top surface of the layer of solder paste 193 is directly attached to a bottom surface of the second metal clip 144. In examples of the present disclosure, the layer of solder paste 193 has a constant thickness.

In examples of the present disclosure, a top surface of the first die paddle 112, a top surface of the second die paddle 114, a top surface of the third die paddle 116, and a top surface of the fourth die paddle 118 are co-planar. A top surface of the flipped first low side FET 122, a top surface of the flipped second low side FET 124, a bottom surface of the first high side FET 126, and a bottom surface of the second high side FET 128 are co-planar. A bottom surface of the flipped first low side FET 122, a bottom surface of the flipped second low side FET 124, a top surface of the first high side FET 126, and a top surface of the second high side FET 128 are co-planar.

In examples of the present disclosure, the first metal clip 142 comprises an elevated section located at a center portion of the first metal clip. The second metal clip 144 comprises an elevated section 148 located at a center portion of the second metal clip so that a top surface of the second high side FET 128 near (for example, less than one hundred microns) the edge 128E of the second high side FET 128 will not be covered by the layer of solder paste 193. In one example, the gate of first low side FET 122 is connected to a lead 111 of the lead frame 110, the gate of second low side FET 124 is connected to a lead 113 of the lead frame 110, the gate of first high side FET 126 is connected to a lead 115 of the lead frame 110, the gate of second high side FET 128 is connected to a lead 117 of the lead frame 110.

FIG. 2A is a top view and FIG. 2B is a cross sectional plot along BB' of a semiconductor package 200 in examples of the present disclosure. The semiconductor package 200 comprises a lead frame 110, a first low side FET 122, a second low side FET 124, a first high side FET 126, a second high side FET 128, a first metal clip 142, a second metal clip 144, a non-conductive adhesive 230, an integrated circuit (IC) controller 250, a plurality of bonding wires 270, and a molding encapsulation 290. In one example, for viewing purpose, the molding encapsulation 290 is shown in transparent in FIGS. 2A and 2B. In one example, the semiconductor package 200 is symmetric with respect to Y axis. The semiconductor package 200 is not symmetric with respect to X axis because the first low side FET 122 is above the X axis and first high side FET 126 is below the X axis. The lead frame 110 comprises a first die paddle 112, a second die paddle 114, a third die paddle 116 and a fourth die paddle 118 (see FIG. 6A).

The molding encapsulation 290 encloses the first low side FET 122, the second low side FET 124, the first high side FET 126, the second high side FET 128, the first metal clip 142, the second metal clip 144, the non-conductive adhesive 230, the IC controller 250, the plurality of bonding wires 270, and a majority portion of the lead frame 110.

In examples of the present disclosure, the semiconductor package 200 is the semiconductor package 100 of FIG. 1A with added non-conductive adhesive 230, added IC controller 250, and added plurality of bonding wires 270 enclosed by the molding encapsulation 290. In one example, the non-conductive adhesive 230 is made of a polyimide material. In another example, the non-conductive adhesive 230 is made of an epoxy material. The plurality of bonding wires 270 connect the electrodes of the IC controller 250 to the pins of the lead frame 110.

A first end 250A of the IC controller 250 is mounted on the first metal clip 142 through a first non-conductive adhesive. A second end 250B of the IC controller 250 is mounted on the second metal clip 144 through a second non-conductive adhesive 230. The first end 250A of the IC controller 250 is directly above the first die paddle 112 of FIG. 6A. The second end 250B of the IC controller 250 is directly above the second die paddle 114 of FIG. 6A.

FIG. 3A is a top view and FIG. 3B is a cross sectional plot along CC' of a semiconductor package 300 in examples of the present disclosure. The semiconductor package 300 comprises a lead frame 110, a first low side FET 122, a second low side FET 124, a first high side FET 126, a second high side FET 128, a first metal clip 142, a second metal clip 144, a conductive adhesive 330, an inductor 350, and a molding encapsulation 390. In one example, for viewing purpose, the molding encapsulation 390 is shown in transparent in FIGS. 3A and 3B. In one example, the semiconductor package 300 is symmetric with respect to Y axis. The semiconductor package 300 is not symmetric with respect to X axis because the first low side FET 122 is above the X axis and first high side FET 126 is below the X axis. The lead frame 110 comprises a first die paddle 112, a second die paddle 114, a third die paddle 116 and a fourth die paddle 118 (see FIG. 6A).

The molding encapsulation 390 encloses the first low side FET 122, the second low side FET 124, the first high side FET 126, the second high side FET 128, the first metal clip 142, the second metal clip 144, the conductive adhesive 330, the inductor 350, and a majority portion of the lead frame 110.

In examples of the present disclosure, the semiconductor package 300 is the semiconductor package 100 of FIG. 1A with added conductive adhesive 330 and added inductor 350 enclosed by the molding encapsulation 390. In one example, the conductive adhesive 330 is made of a solder paste material.

A first end 350A of the inductor 350 is mounted on the first metal clip 142 through a first conductive adhesive. A second end 350B of the inductor 350 is mounted on the second metal clip 144 through a second conductive adhesive 330. The first end 350A of the inductor 350 is directly above the third die paddle 116 of FIG. 6A. The second end 350B of the inductor 350 is directly above the fourth die paddle 118 of FIG. 6A.

FIG. 4A is a top view and FIG. 4B is a cross sectional plot along DD' of a semiconductor package 400 in examples of the present disclosure. The semiconductor package 400 comprises a lead frame 110, a first low side FET 122, a second low side FET 124, a first high side FET 126, a second high side FET 128, a first metal clip 142, a second metal clip 144, a non-conductive adhesive 230, an IC controller 250, a plurality of bonding wires 270, a conductive adhesive 330, an inductor 350, and a molding encapsulation 490. In one example, for viewing purpose, the molding encapsulation 490 is shown in transparent in FIGS. 4A and 4B. In one example, the semiconductor package 400 is symmetric with respect to Y axis. The semiconductor package 400 is not symmetric with respect to X axis because the first low side FET 122 is above the X axis and first high side FET 126 is below the X axis. The lead frame 110 comprises a first die paddle 112, a second die paddle 114, a third die paddle 116 and a fourth die paddle 118 (see FIG. 6A).

The molding encapsulation 490 encloses the first low side FET 122, the second low side FET 124, the first high side FET 126, the second high side FET 128, the first metal clip 142, the second metal clip 144, the non-conductive adhesive 230, the IC controller 250, the plurality of bonding wires 270, the conductive adhesive 330, the inductor 350, and a majority portion of the lead frame 110.

In examples of the present disclosure, the semiconductor package 400 is the semiconductor package 300 of FIG. 3A with added non-conductive adhesive 230, added IC controller 250, and added plurality of bonding wires 270 enclosed by the molding encapsulation 490. In one example, the non-conductive adhesive 230 is made of a polyimide material. In another example, the non-conductive adhesive 230 is made of an epoxy material. The plurality of bonding wires 270 connect the electrodes of the IC controller 250 to the pins of the lead frame 110.

A first end 250A of the IC controller 250 is mounted on the first metal clip 142 through a first non-conductive adhesive. A second end 250B of the IC controller 250 is mounted on the second metal clip 144 through a second non-conductive adhesive 230. The first end 250A of the IC controller 250 is directly above the first die paddle 112 of FIG. 6A. The second end 250B of the IC controller 250 is directly above the second die paddle 114 of FIG. 6A. In one example, the IC controller 250 is disposed above the first and second low side FETs 122 and 124.

FIG. 5 is a flowchart of a process 500 to develop a semiconductor package in examples of the present disclosure. The process 500 may start from block 502. For simplicity, the right one in dashed lines of FIG. 12 (same structure as the corresponding left one in solid lines) is not shown in FIGS. 6A, 7A, 8A, 9A, 10A, and 11A.

Figures 6A, 6B:
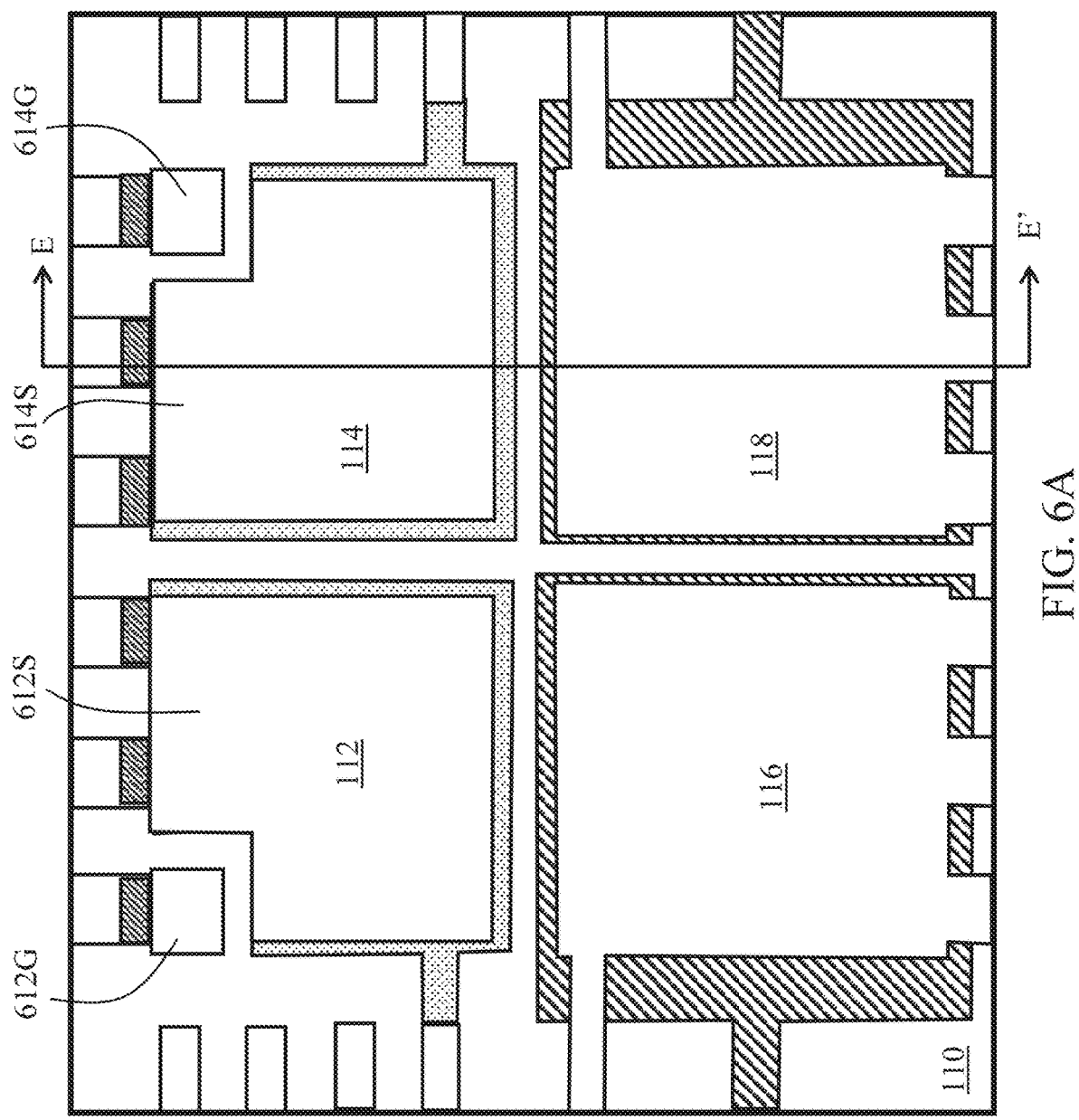
Figures 11A, 11B:
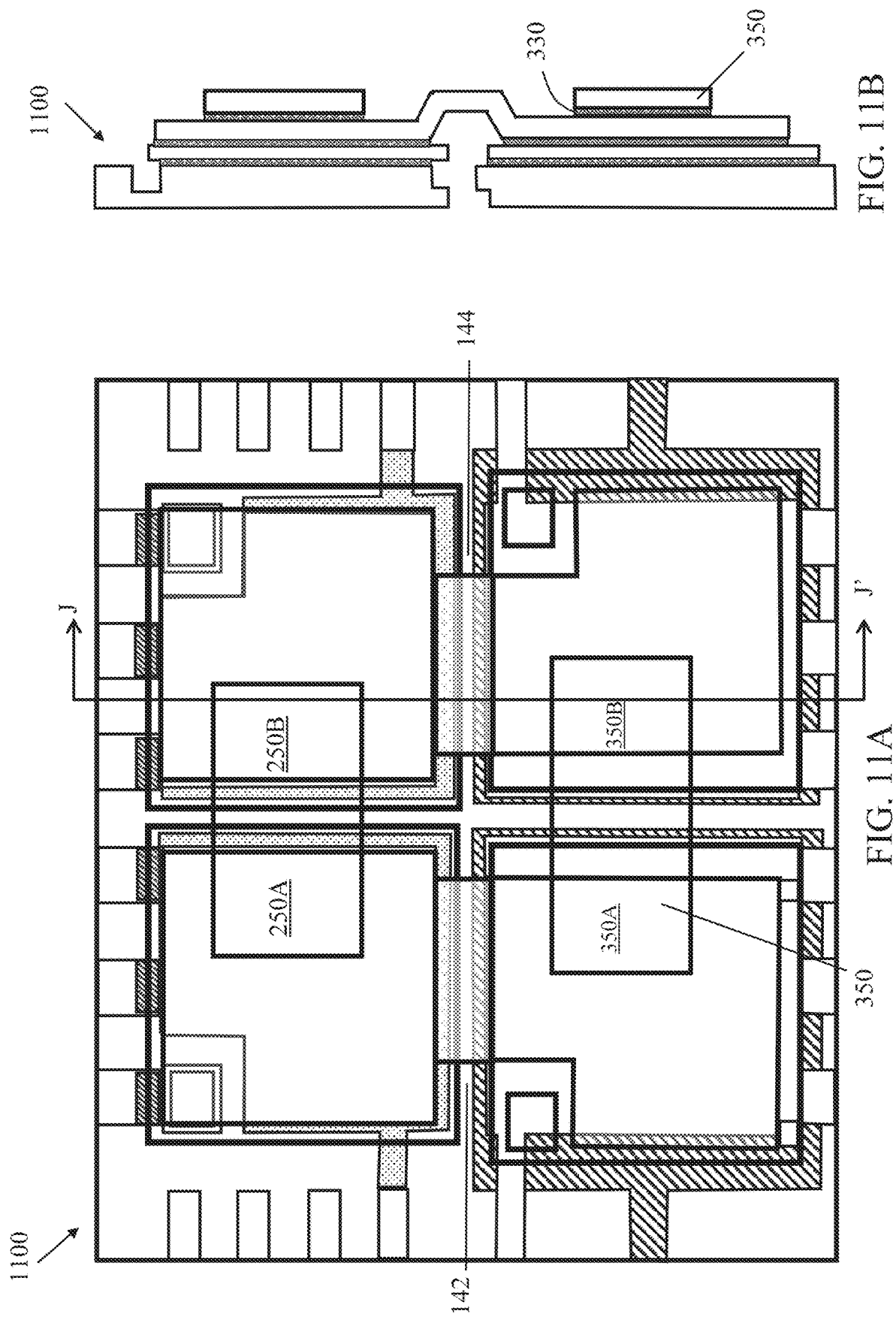

In block 502, referring now to FIGS. 6A and 6B (along EE'), a lead frame 110 is provided. The lead frame 110 comprises a first die paddle 112, a second die paddle 114, a third die paddle 116 and a fourth die paddle 118. Block 502 may be followed by block 504.

In block 504, referring now to FIGS. 7A and 7B (along FF'), a first low side FET 122 is flipped and attached to the first die paddle 112 of FIG. 6A. The first low side FET 122 comprises a source electrode on a top surface of the first low side FET 122 (flipped and connected to source pad 612S of the first die paddle 112 of FIG. 6A) and a gate electrode on a top surface of the first low side FET 122 (flipped and connected to gate pad 612G of FIG. 6A). The second low side FET 124 is attached to the second die paddle 114. The second low side FET 124 comprises a source electrode 174S on a top surface of the second low side FET 124 (flipped and connected to source pad 614S of the second die paddle 114 of FIG. 6A) and a gate electrode on a top surface of the second low side FET 124 (flipped and connected to gate pad 614G of FIG. 6A). The first high side FET 126 is attached to the third die paddle 116 of FIG. 6A. The first high side FET 126 comprises a source electrode and a gate electrode 176G on a top surface of the first high side FET 126 and a drain electrode on the bottom surface of the first high side FET 126 connected to the third die paddle 116 of FIG. 6A. The second high side FET 128 is attached to the fourth die paddle 118. The second high side FET 128 comprises a source electrode 178S and a gate electrode 178G on a top surface of the second high side FET 128 and a drain electrode on the bottom surface of the second high side FET 128 connected to the fourth die paddle 118.

In examples of the present disclosure, the second high side FET 128 is attached to the fourth die paddle 118 through a layer of solder paste 191. A top surface of the fourth die paddle 118 is directly attached to a bottom surface of the layer of solder paste 191. A top surface of the layer of solder paste 191 is directly attached to a bottom surface of the second high side FET 128. In examples of the present disclosure, the layer of solder paste 191 has a constant thickness. Block 504 may be followed by block 506.

In block 506, referring now to FIGS. 8A and 8B (along GG'), the first metal clip 142 connects a drain electrode of the flipped first low side FET 122 of FIG. 7A to the source electrode of the first high side FET 126 of FIG. 7A. A second metal clip 144 connects a drain electrode 174D of the flipped second low side FET 124 to the source electrode 178S of the second high side FET 128.

The second metal clip 144 is attached to the second high side FET 128 through a layer of solder paste 193. A top surface of the second high side FET 128 is directly attached to a bottom surface of the layer of solder paste 193. A top surface of the layer of solder paste 193 is directly attached to a bottom surface of the second metal clip 144. In examples of the present disclosure, the layer of solder paste 193 has a constant thickness.

In examples of the present disclosure, the first metal clip 142 comprises an elevated section located at a center portion of the first metal clip. The second metal clip 144 comprises an elevated section 148 located at a center portion of the second metal clip so that a top surface of the second high side FET 128 near (for example, less than one hundred microns) the edge 128E of the second high side FET 128 will not be covered by the layer of solder paste 193.

Block 506 may be followed by block 508, block 510, or block 514. When block 506 is directly followed by block 514, the fabricated semiconductor package 100 of FIG. 1A does not contain an IC controller or an inductor. When block 506 is directly followed by block 510, then directly followed by block 514, the fabricated semiconductor package 200 of FIG. 2A contains an IC controller 250, but does not contain an inductor. When block 506 is directly followed by block 508, then directly followed by block 514, the fabricated semiconductor package 300 of FIG. 3A contains an inductor 350, but does not contain an IC controller 250. When block 506 is directly followed by block 508, then directly followed by block 510, then directly followed by block 514, the fabricated semiconductor package 400 of FIG. 4A or the intermediate semiconductor package 1100 of FIGS. 11A and 11B (along JJ') contains an IC controller 250 and an inductor 350. In examples of the present disclosure, block 510 is after block 508 because the processing temperature (340-360 degrees centigrade) of the conductive adhesive 330 is higher than the processing temperature (160-180 degrees centigrade) of the non-conductive adhesive 230.

In optional block 508 (shown in dashed lines), referring now to FIGS. 10A and 10B (along II'), a first end 350A of the inductor 350 is mounted on the first metal clip 142 through a first conductive adhesive. A second end 350B of the inductor 350 is mounted on the second metal clip 144 through a second conductive adhesive 330. The first end 350A of the inductor 350 is directly above the third die paddle 116 of FIG. 6A. The second end 350B of the inductor 350 is directly above the fourth die paddle 118 of FIG. 6A. Block 508 may be followed by block 510 or block 514.

In optional block 510 (shown in dashed lines), referring now to FIGS. 9A and 9B (along HH'), a first end 250A of the IC controller 250 is mounted on the first metal clip 142 through a first non-conductive adhesive. A second end 250B of the IC controller 250 is mounted on the second metal clip 144 through a second non-conductive adhesive 230. The first end 250A of the IC controller 250 is directly above the first die paddle 112 of FIG. 6A. The second end 250B of the IC controller 250 is directly above the second die paddle 114 of FIG. 6A. Block 510 may be followed by block 512.

Optional block 512 will be executed only if optional block 510 is executed. In optional block 512 (shown in dashed lines), referring now to FIGS. 2A and 4A, a plurality of bonding wires are applied to connect electrodes of the IC controller 250 to pins of the lead frame 110. Block 512 may be followed by block 514.

In block 514, a molding encapsulation 190 of FIG. 1B, a molding encapsulation 290 of FIG. 2B, a molding encapsulation 390 of FIG. 3B, or a molding encapsulation 490 of FIG. 4B is formed depending on if optional Block 508 or optional Block 510 is executed. Block 514 may be followed by block 516.

In block 516, referring now to FIG. 12, a singulation process along the line 1230 is applied. The semiconductor package 1200 is separated from an adjacent semiconductor package 1202 (shown in dashed lines). Although only two semiconductor packages are shown in FIG. 12. The number of semiconductor packages to be separated in a same singulated process may vary.

FIG. 13A is a bottom view, and FIG. 13B is a side view, and FIG. 13C is a front view of a semiconductor package 1300 in examples of the present disclosure. A portion of a bottom surface of a lead frame 1310 is exposed from a molding encapsulation 1390.

Those of ordinary skill in the art may recognize that modifications of the embodiments disclosed herein are possible. For example, a height of the elevated section 148 of the second metal clip 144 may vary. Other modifications may occur to those of ordinary skill in this art, and all such modifications are deemed to fall within the purview of the present invention, as defined by the claims.

The invention claimed is:

1. A semiconductor package comprising:
   a lead frame comprising
      a first, second, third and fourth die paddles separated from one another, the first die paddle and the second die paddle facing each other, and the third die paddle and the fourth die paddle facing each other;
   a first low side field-effect transistor (FET) being flipped and attached to the first die paddle, the first low side FET comprising a source electrode and a gate electrode on a top surface of the first low side FET;
   a second low side FET being flipped and attached to the second die paddle, the second low side FET comprising a source electrode and a gate electrode on a top surface of the second low side FET;
   a first high side FET attached to the third die paddle, the first high side FET comprising a source electrode and a gate electrode on a top surface of the first high side FET;
   a second high side FET attached to the fourth die paddle, the second high side FET comprising a source electrode and a gate electrode on a top surface of the second high side FET;
   a first metal clip connecting a drain electrode of the first low side FET to the source electrode of the first high side FET;
   a second metal clip connecting a drain electrode of the second low side FET to the source electrode of the second high side FET; and
   a molding encapsulation enclosing the first low side FET, the second low side FET, the first high side FET, the second high side FET, the first metal clip, the second metal clip, and a majority portion of the lead frame.

2. The semiconductor package of claim 1, wherein the first metal clip comprises an elevated section located at a center portion of the first metal clip; and
   wherein the second metal clip comprises an elevated section located at a center portion of the second metal clip.

3. The semiconductor package of claim 1 further comprising an integrated circuit (IC) controller,
   wherein a first end of the IC controller is mounted on the first metal clip through a first non-conductive adhesive;
   wherein a second end of the IC controller is mounted on the second metal clip through a second non-conductive adhesive;
   wherein the first end of the IC controller is above the first die paddle; and
   wherein the second end of the IC controller is above the second die paddle.

4. The semiconductor package of claim 3, wherein the molding encapsulation further encloses the IC controller.

5. The semiconductor package of claim 1, further comprising an inductor,
   wherein a first end of the inductor is mounted on the first metal clip through a first conductive adhesive;
   wherein a second end of the inductor is mounted on the second metal clip through a second conductive adhesive;
   wherein the first end of the inductor is above the third die paddle; and
   wherein the second end of the inductor is above the fourth die paddle.

6. The semiconductor package of claim 5 further comprising an integrated circuit (IC) controller,
   wherein a first end of the IC controller is mounted on the first metal clip through a first non-conductive adhesive;
   wherein a second end of the IC controller is mounted on the second metal clip through a second non-conductive adhesive;
   wherein the first end of the IC controller is above the first die paddle; and
   wherein the second end of the IC controller is above the second die paddle.

7. The semiconductor package of claim 6, wherein the IC controller is disposed above the first low side FET and the second low side FET; wherein the inductor is disposed above the first high side FET and the second high side FET; and wherein the molding encapsulation further encloses the inductor and the IC controller.

8. The semiconductor package of claim 7, wherein a bottom surface of the first die paddle is exposed from the molding encapsulation; a bottom surface of the second die paddle is exposed from the molding encapsulation; a bottom surface of the third die paddle is exposed from the molding encapsulation; and a bottom surface of the fourth die paddle is exposed from the molding encapsulation.

9. The semiconductor package of claim 1, wherein the first metal clip comprises an elevated section located at a center portion of the first metal clip;
   wherein the second metal clip comprises an elevated section located at a center portion of the second metal clip; and
   wherein a bottom surface of the flipped first low side FET, a bottom surface of the flipped second low side FET, the top surface of the first high side FET, and the top surface of the second high side FET are co-planar.

10. The semiconductor package of claim 1, wherein an entirety of the molding encapsulation is formed in a same fabrication step.

11. A semiconductor package comprising:
a lead frame comprising
a first, second, third and fourth die paddles separated from one another, the first die paddle and the second die paddle facing each other, and the third die paddle and the fourth die paddle facing each other;
a first low side field-effect transistor (FET) being flipped and attached to the first die paddle, the first low side FET comprising a source electrode and a gate electrode on a top surface of the first low side FET;
a second low side FET being flipped and attached to the second die paddle, the second low side FET comprising a source electrode and a gate electrode on a top surface of the second low side FET;
a first high side FET attached to the third die paddle, the first high side FET comprising a source electrode and a gate electrode on a top surface of the first high side FET;
a second high side FET attached to the fourth die paddle, the second high side FET comprising a source electrode and a gate electrode on a top surface of the second high side FET;
a first metal clip connecting a drain electrode of the first low side FET to the source electrode of the first high side FET;
a second metal clip connecting a drain electrode of the second low side FET to the source electrode of the second high side FET; and
a molding encapsulation enclosing the first low side FET, the second low side FET, the first high side FET, the second high side FET, the first metal clip, and the second metal clip.

12. The semiconductor package of claim 11, wherein the first metal clip comprises an elevated section located at a center portion of the first metal clip;
wherein the second metal clip comprises an elevated section located at a center portion of the second metal clip; and
wherein a bottom surface of the flipped first low side FET, a bottom surface of the flipped second low side FET,
the top surface of the first high side FET, and the top surface of the second high side FET are co-planar.

13. The semiconductor package of claim 11, wherein an entirety of the molding encapsulation is formed in a same fabrication step.

14. The semiconductor package of claim 11, further comprising
an integrated circuit (IC) controller,
wherein a first end of the IC controller is mounted on the first metal clip through a first non-conductive adhesive;
wherein a second end of the IC controller is mounted on the second metal clip through a second non-conductive adhesive;
wherein the first end of the IC controller is above the first die paddle; and
wherein the second end of the IC controller is above the second die paddle.

15. The semiconductor package of claim 11, further comprising an inductor,
wherein a first end of the inductor is mounted on the first metal clip through a first conductive adhesive;
wherein a second end of the inductor is mounted on the second metal clip through a second conductive adhesive;
wherein the first end of the inductor is above the third die paddle; and
wherein the second end of the inductor is above the fourth die paddle.

16. The semiconductor package of claim 15 further comprising an integrated circuit (IC) controller,
wherein a first end of the IC controller is mounted on the first metal clip through a first non-conductive adhesive;
wherein a second end of the IC controller is mounted on the second metal clip through a second non-conductive adhesive;
wherein the first end of the IC controller is above the first die paddle; and
wherein the second end of the IC controller is above the second die paddle.

17. The semiconductor package of claim 16, wherein the IC controller is disposed above the first low side FET and the second low side FET; wherein the inductor is disposed above the first high side FET and the second high side FET; and wherein the molding encapsulation further encloses the inductor and the IC controller.

* * * * *